United States Patent
Lin et al.

(10) Patent No.: US 10,360,174 B1
(45) Date of Patent: Jul. 23, 2019

(54) UNIVERSAL SERIAL BUS CIRCUIT

(71) Applicant: VIA LABS, INC., New Taipei (TW)

(72) Inventors: Hsiao-Chyi Lin, New Taipei (TW); Yi-Shing Lin, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 16/102,744

(22) Filed: Aug. 14, 2018

(30) Foreign Application Priority Data

Jul. 27, 2018 (TW) .............................. 107125973 A (51) Int. Cl.
*G06F 13/42* (2006.01)
*G06F 13/38* (2006.01)
*G06F 13/40* (2006.01)
*H03K 17/687* (2006.01)

(52) U.S. Cl.
CPC ........ *G06F 13/4282* (2013.01); *G06F 13/385* (2013.01); *G06F 13/4068* (2013.01); *H03K 17/687* (2013.01); *G06F 2213/0042* (2013.01)

(58) Field of Classification Search
None
See application file for complete search history.

(56) References Cited

FOREIGN PATENT DOCUMENTS

| CN | 101751358 | 6/2010 |
|----|-----------|--------|
| WO | 2016032522 | 3/2016 |

OTHER PUBLICATIONS

"Office Action of Taiwan Counterpart Application," dated Apr. 3, 2019, p. 1-p. 8.

*Primary Examiner* — Farley Abad
*Assistant Examiner* — Dayton Lewis-Taylor
(74) *Attorney, Agent, or Firm* — JCIPRNET (57) ABSTRACT

A universal serial bus circuit including a power circuit and a terminating circuit is provided. The power circuit provides a differential signal. The terminating circuit is coupled to the power circuit. The terminating circuit receives the differential signal through the first signal output terminal and the second signal output terminal, and the terminating circuit includes a first load circuit and a second load circuit. When the universal serial bus circuit is operated in a handshake mode, the terminating circuit receives the differential signal through the first load circuit and the second load circuit, and outputs a pulse signal through the first signal output terminal and the second signal output terminal. When the universal serial bus circuit is operated in a normal mode, the terminating circuit receives the differential signal through the first load circuit, and outputs a data signal through the first signal output terminal and the second signal output terminal.

16 Claims, 5 Drawing Sheets

UNIVERSAL SERIAL BUS CIRCUIT

CROSS-REFERENCE TO RELATED APPLICATION

This application claims the priority benefit of Taiwan application serial no. 107125973, filed on Jul. 27, 2018. The entirety of the above-mentioned patent application is hereby incorporated by reference herein and made a part of this specification.

BACKGROUND OF THE INVENTION

1. Field of the Invention

The invention relates to a bus circuit, and more particularly, to a USB (Universal Serial Bus) circuit.

2. Description of Related Art

In general, USB (Universal Serial Bus) 2.0 supports full speed and high speed data transmissions. Under the USB 2.0 standard, when a USB device served as a host is coupled to a device side equipment, the USB device and the device side equipment would first perform a handshake mode to confirm each other's data transmission capabilities. That is to say, before performing a transmission task for a data signal, the USB device served as the host would alternately transmit negative pulse signals and positive pulse signals to the device side equipment such that the device side equipment can effectively confirm whether the USB device can support the high speed data transmission. In other words, when the device side equipment is unable to respond to the negative pulse signals and the positive pulse signals alternately transmitted by the USB device, the device side equipment would confirm that the data transmission between the USB device and the device side equipment can only be operated in the full speed data transmission. Otherwise, the device side equipment would confirm that the data transmission between the USB device and the device side equipment can be operated in the high speed data transmission.

During the handshake mode, the USB device would generate the negative pulse signals and the positive pulse signals through a terminating circuit in the USB circuit, where the negative pulse signal is a Chirp K signal and the positive pulse signal is a Chirp J signal. However, the terminating circuit of a general USB circuit only receives a differential signal provided by a current source through two switch transistors, and correspondingly outputs the pulse signal and the data signal to the device side equipment. In this regard, because voltage values of the Chirp K signal and the Chirp J signal are higher than a voltage value of the data transmission, the switch transistors of a general terminating circuit would have to bear a greater current during the handshake mode. Consequently, the switch transistors of the terminating circuit may be operated in a saturation region instead of a linear region. Therefore, voltage instability or voltage drift can occur on the Chirp K signal and the Chirp J signal generated by the general USB device. In consideration of the above, solutions regarding how to design a USB circuit to stably output the Chirp K signal and the Chirp J signal during the handshake mode are provided below with reference several embodiments.

SUMMARY OF THE INVENTION

The invention provides a USB (Universal Serial Bus) circuit capable of effectively generating the pulse signal (the Chirp K signal and the Chirp J signal) and the data signal applicable to the USB 2.0 high speed transmission.

The universal serial bus circuit of the invention includes a power circuit and a terminating circuit. The power circuit provides a differential signal. The terminating circuit is coupled to the power circuit. The terminating circuit is configured to receive the differential signal through a first signal output terminal and a second signal output terminal. The terminating circuit includes a first load circuit and a second load circuit. When the universal serial bus circuit is operated in a normal mode, the terminating circuit receives the differential signal through the first load circuit, and outputs a data signal through the first signal output terminal and the second signal output terminal. When the universal serial bus circuit is operated in a handshake mode, the terminating circuit receives the differential signal through the first load circuit and the second load circuit, and outputs a pulse signal through the first signal output terminal and the second signal output terminal.

Based on the above, the universal serial bus circuit of the invention can support the USB 2.0 high speed transmission and can effectively provide the pulse signal (the Chirp K signal and the Chirp J signal) and the data signal through the terminating circuit. In addition, the universal serial bus circuit of the invention can also effectively reduce power consumption of the USB circuit and reduce circuit area.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In order to make content of the invention more comprehensible, embodiments are described below as the examples to prove that the invention can actually be realized. Moreover, elements/components/steps with same reference numerals represent same or similar parts in the drawings and embodiments.

Figure 1:
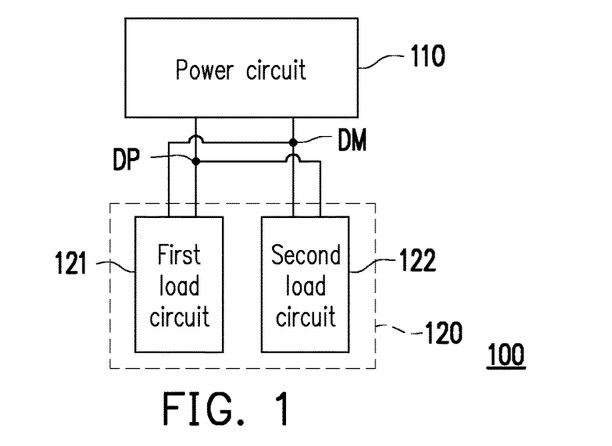
FIG. 1 is a schematic diagram of a USB circuit according to an embodiment of the invention.

FIG. 1 is a schematic diagram of a USB circuit according to an embodiment of the invention. With reference to FIG. 1, a USB (Universal Serial Bus) circuit 100 includes a power circuit 110 and a terminating circuit 120. The power circuit 110 is coupled to the terminating circuit 120. In this embodiment, the terminating circuit 120 includes a first load circuit 121 and a second load circuit 122. The power circuit 110 is coupled to the first load circuit 121 and the second load circuit 122 through signal output terminals DP and DM. The power circuit 110 is configured to selectively provide a differential signal to the first load circuit 121 and the second load circuit 122.

In this embodiment, the USB circuit 100 can support the USB 2.0 high speed transmission. Accordingly, when the USB circuit 100 is coupled to an external device through the signal output terminals DP and DM, and when the USB circuit 100 is operated in a handshake mode, the USB circuit 100 outputs a pulse signal to the external device through the signal output terminals DP and DM. Herein, the pulse signal refers to a plurality of negative pulse signals (Chirp K signals) and a plurality of positive pulse signals (Chirp J signals) output by the USB circuit 100 through the signal output terminals DP and DM, and the negative pulse signals (the Chirp K signals) and the positive pulse signals (the Chirp J signals) are alternately arranged. A voltage of the positive pulse signal (the Chirp J signal) may fall between 700 and 1100 millivolt (mV), and a voltage of the negative pulse signal may fall between −900 and −500 mV. In other words, when the external device receives the positive pulse signals (the Chirp J signals) and the negative pulse signals (the Chirp K signals) alternately output by the USB circuit 100, the external device can effectively confirm that the USB circuit 100 can support the USB 2.0 high speed transmission so a data transmission between the USB circuit 100 and the external device can be operated in a transmission speed of 480 million bits per second (Mbps).

In this embodiment, the USB circuit 100 can receive the differential signal output by the power circuit 110 through the first load circuit 121 and the second load circuit 122, and output the corresponding pulse signal and a data signal. Specifically, when the USB circuit 100 is operated in the handshake mode, the terminating circuit 120 receives the differential signal through the first load circuit 121 and the second load circuit 122, and alternately outputs the positive pulse signals (the Chirp J signals) and the negative pulse signals (the Chirp K signals) to the external device through the signal output terminals DP and DM. Nonetheless, when the USB circuit 100 is operated in a normal mode (or known as a data transmission mode), the terminating circuit 120 only receives the differential signal output by the power circuit 110 through the first load circuit 121, and outputs the data signal to the external device through the signal output terminals DP and DM.

Figure 2:
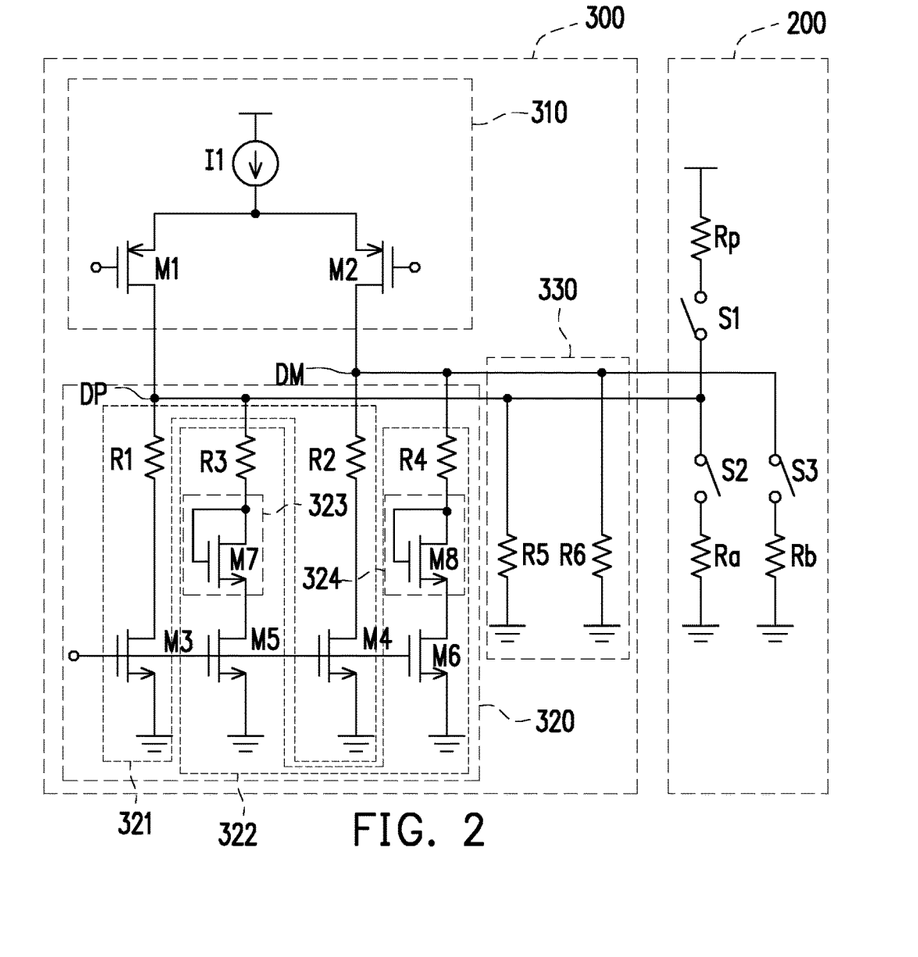
FIG. 2 is a circuit diagram of a USB circuit according to an embodiment of the invention.

FIG. 2 is a circuit diagram of a USB circuit according to an embodiment of the invention. With reference to FIG. 2, a USB circuit 300 includes a power circuit 310, a terminating circuit 320 and a pull-down circuit 330. The terminating circuit 320 includes a first load circuit 321 and a second load circuit 322. The USB circuit 300 is coupled to a device side circuit 200 through signal output terminals DP and DM. In this embodiment, the device side circuit 200 refers to, for example, an equivalent circuit of a USB port of computer equipment, but the invention is not limited thereto. In this embodiment, the device side circuit 200 may include a pull-up resistor Rp and reference resistors Ra and Rb. The pull-up resistor Rp is coupled to a switch S1. One terminal of the reference resistor Ra is coupled to a switch S2, and another terminal of the reference resistor Ra is coupled to a ground terminal. One terminal of the reference resistor Rb is coupled to a switch S3, and another terminal of the reference resistor Rb is coupled to the ground terminal.

The power circuit 310 includes a current source circuit and transistors M1 and M2. The current source circuit includes an input/output power (I/O power) I1, and the I/O power I1 can provide, for example, a power signal of 3.3 volt (V). A first terminal of the transistor M1 is coupled to the I/O power I1. A second terminal of the transistor M1 is coupled to the signal output terminal DP. A first terminal of the transistor M2 is coupled to the I/O power I1. A second terminal of the transistor M2 is coupled to the signal output terminal DM. In this embodiment, the second terminal of the transistor M1 and the second terminal of the transistor M2 can alternately output the power signal provided by the I/O power I1 through the signal output terminals DP and DM to form the differential signal.

The first load circuit 321 includes resistors R1 and R2 and transistors M3 and M4. A first terminal of the resistor R1 is coupled to the signal output terminal DP. In this embodiment, a first terminal of the transistor M3 is coupled to a second terminal of the resistor R1, and a second terminal of the transistor M3 is coupled to the ground terminal. A first terminal of the resistor R2 is coupled to the signal output terminal DM. A first terminal of the transistor M4 is coupled to a second terminal of the resistor R2, and a second terminal of the transistor M4 is coupled to the ground terminal.

The second load circuit 322 includes resistors R3 and R4, diode units 323 and 324 and transistors M5 and M6. In this embodiment, a first terminal of the resistor R3 is coupled to the signal output terminal DP. The diode unit 323 is coupled to a second terminal of the resistor R3. A first terminal of the transistor M5 is coupled to the diode unit 323, and a second terminal of the transistor M5 is coupled to the ground terminal. A first terminal of the resistor R4 is coupled to the signal output terminal DM. The diode unit 324 is coupled to a second terminal of the resistor R4. A first terminal of the transistor M6 is coupled to the diode unit 324, and a second terminal of the transistor M6 is coupled to the ground terminal. In this embodiment, the diode unit 323 may include a transistor M7, and the diode unit 324 may include a transistor M8. A first terminal of the transistor M7 is coupled to the resistor R3. A control terminal of the transistor M7 is coupled to the first terminal of the transistor M7. A second terminal of the transistor M7 is coupled to the first terminal of the transistor M5. A first terminal of the transistor M8 is coupled to the resistor R4. A control terminal of the transistor M8 is coupled to the first terminal of the transistor M8. A second terminal of the transistor M8 is coupled to the first terminal of the transistor M6. Nevertheless, the diode units 323 and 324 may also be diode circuits in other forms, and the diode units 323 and 324 of the invention are not limited by FIG. 2. In addition, the pull-down circuit 330 includes resistors R5 and R6, and the resistance of the resistors R5 and R6 may be 15 k Ohm.

In this embodiment, when the USB circuit 300 is coupled to the device side circuit 200 through the signal output terminals DP and DM, the USB circuit 300 serves as a host, and outputs a USB reset signal to the device side circuit 200. Because the device side circuit 200 supports the USB 2.0 high speed transmission, the device side circuit 200 then outputs the negative pulse signals (the Chirp K signals) to the USB circuit 300 so the USB circuit 300 can confirm that the device side circuit 200 supports the USB 2.0 high speed transmission. Next, the USB circuit 300 alternately returns the negative pulse signals (the Chirp K signals) and the positive pulse signals (the Chirp J signals) to the device side circuit 200 so the device side circuit 200 can effectively confirm that the USB circuit 300 supports the USB 2.0 high speed transmission. Lastly, the USB circuit 300 may enter the normal mode, and output the data signal to the device side circuit 200.

Figure 3:
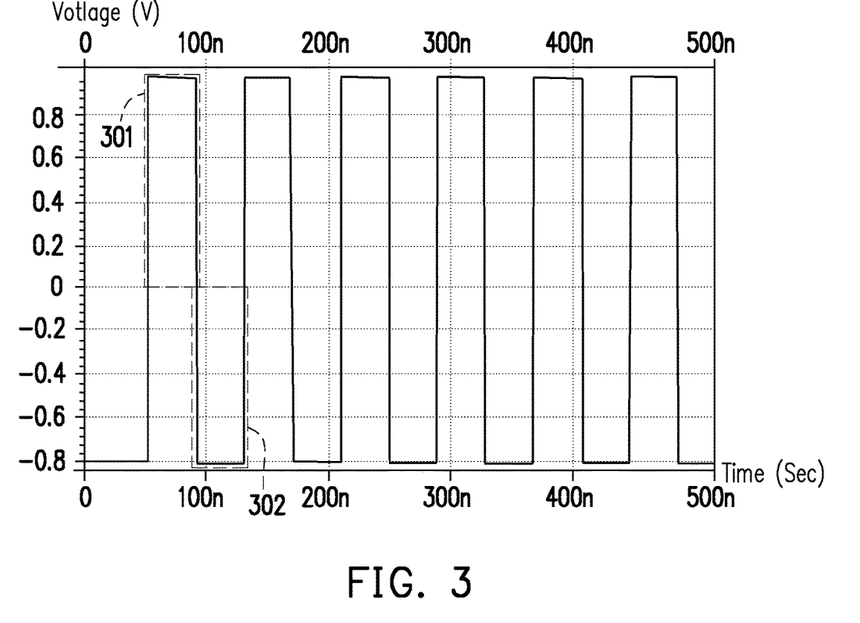
FIG. 3 is a signal waveform diagram of the pulse signal according to the embodiment of FIG. 2.

FIG. 3 is a signal waveform diagram of the pulse signal according to the embodiment of FIG. 2. With reference to FIG. 2 and FIG. 3, when the USB circuit 300 is operated in the handshake mode, the USB circuit 300 can output positive pulse signals 301 and negative pulse signals 302 alternately arranged as shown in FIG. 3 to the device side circuit 200 through the signal output terminals DP and DM. Specifically, when the USB circuit 300 is operated in the handshake mode, because the switches S2 and S3 of the device side circuit 200 are not turned on, the terminating circuit 320 would bear a greater current. Thus, the USB circuit 300 would output the positive pulse signals 301 and the negative pulse signals 302 to the device side circuit 200 through the signal output terminals DP and DM. In this embodiment, a peak voltage of the positive pulse signal 301 may be 900 mV, and a peak voltage of the negative pulse signal 302 may be −800 mV.

That is to say, the transistors M3 and M4 are turned on, and the first load circuit 321 can receive a current provided by the I/O power I1. At the time, because voltages of the signal output terminals DP and DM are greater, the transistors M7 and M8 may also be turned on so the first load circuit 321 and the second load circuit 322 can share the current provided by the I/O power I1 at the same time. In other words, when the USB circuit 300 is operated in the handshake mode, the terminating circuit 320 of the present embodiment can effectively prevent the transistors M3 and M4 of the first load circuit 321 from bearing the overly large current, which may make the transistors M3 and M4 entering the saturation region from the linear region thereby causing voltage drift on the pulse signal (the Chirp K signal and the Chirp J signal) output by the signal output terminals DP and DM.

Figure 4:
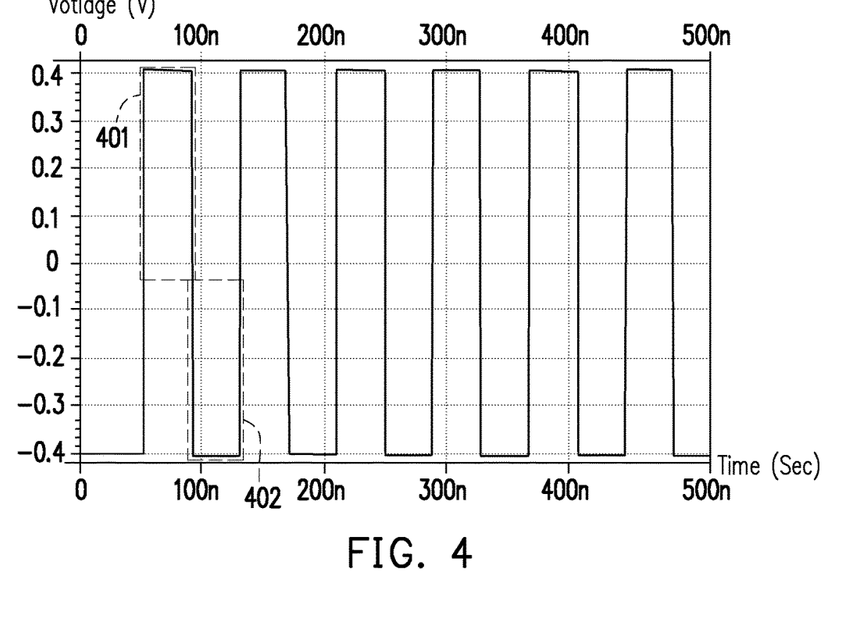
FIG. 4 is a signal waveform diagram of the data signal according to the embodiment of FIG. 2.

FIG. 4 is a signal waveform diagram of the data signal according to the embodiment of FIG. 2. With reference to FIG. 2 and FIG. 4, when the USB circuit 300 is operated in the normal mode, the switches S2 and S3 of the device side circuit 200 are turned on so the reference resistors Ra and Rb of the device side circuit 200 and the terminating circuit 320 can share the current at the same time. The USB circuit 300 would alternately output data signals 401 and 402 as shown in FIG. 4 to the device side circuit 200 through the signal output terminals DP and DM. The data signals 401 and 402 form the differential signal. A voltage peak of the data signal 401 may be 400 mV, and a voltage peak of the data signal 402 may be −400 mV. That is to say, the transistors M3 and M4 and the switches S2 and S3 are turned on so the first load circuit 321 and the reference resistors Ra and Rb can receive the current provided by the I/O power I1. At the time, because the voltages of the signal output terminals DP and DM are smaller, the transistors M7 and M8 would not be turned on. Therefore, when the USB circuit 300 is operated in the normal mode, the current provided by the I/O power I1 would not flow through the second load circuit 322.

Figure 5:
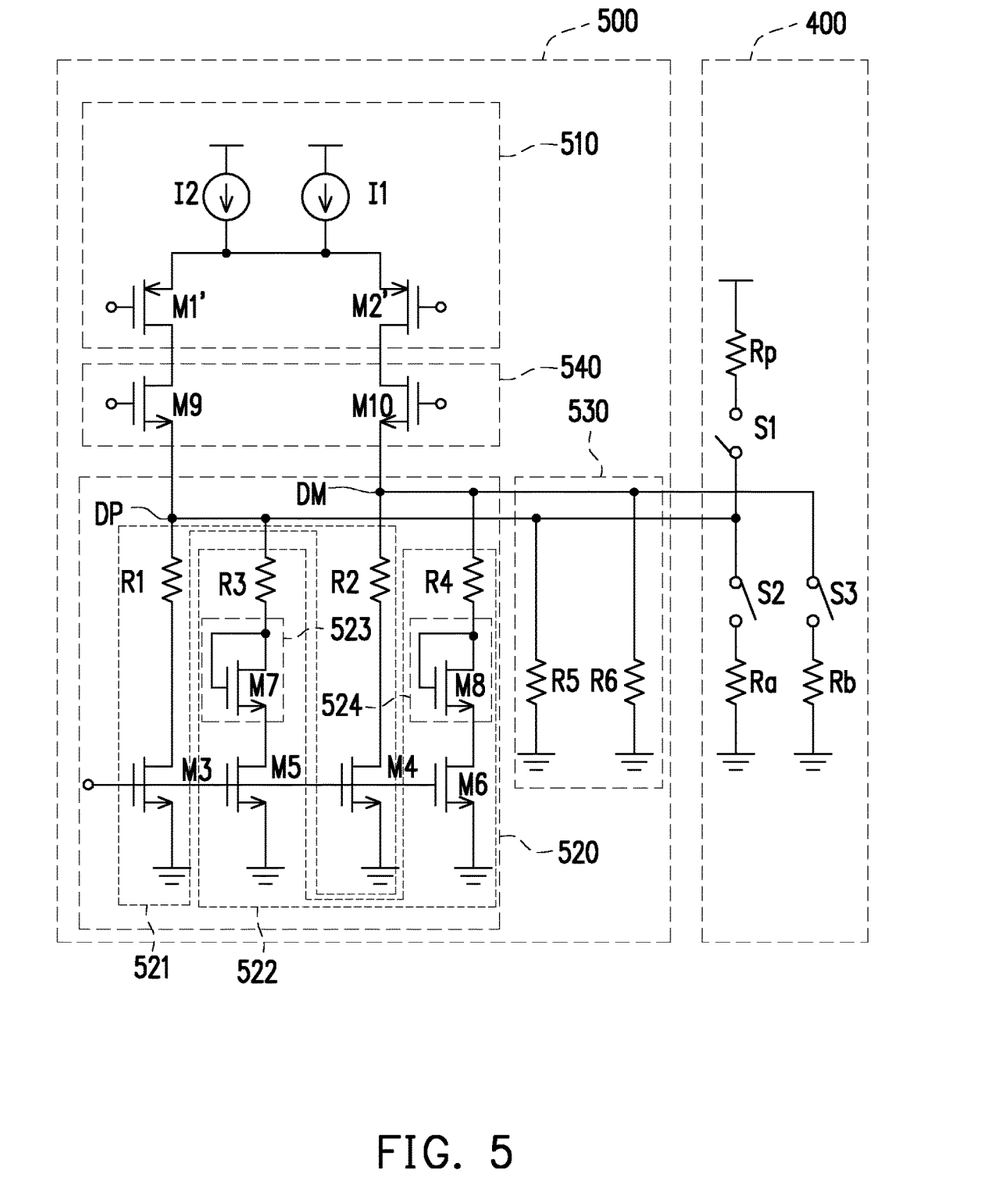
FIG. 5 is a circuit diagram of a USB circuit according to another embodiment of the invention.

FIG. 5 is a circuit diagram of a USB circuit according to another embodiment of the invention. With reference to FIG. 5, a USB circuit 500 includes a power circuit 510, a terminating circuit 520, a pull-down circuit 530 and a protection circuit 540. The terminating circuit 520 includes a first load circuit 521 and a second load circuit 522. The USB circuit 500 is coupled to a device side circuit 400 through signal output terminals DP and DM. In this embodiment, the device side circuit 400 refers to, for example, an equivalent circuit of a USB port of computer equipment, but the invention is not limited thereto. In this embodiment, the device side circuit 400 may include, for example, a pull-up resistor Rp and reference resistors Ra and Rb. The pull-up resistor Rp is coupled to a switch S1. One terminal of the reference resistor Ra is coupled to a switch S2, and another terminal of the reference resistor Ra is coupled to a ground terminal. One terminal of the reference resistor Rb is coupled to a switch S3, and another terminal of the reference resistor Rb is coupled to the ground terminal.

The power circuit 510 includes a current source circuit and transistors M1' and M2'. The current source circuit includes an I/O power I1 and a core power I2. The I/O power I1 may provide, for example, a power signal of 3.3 V, and the core power I2 may provide, for example, a power signal of 1.05 V. A first terminal of the transistor M1' is coupled to the I/O power I1 and the core power I2. A second terminal of the transistor M1' is coupled to the signal output terminal DP. A first terminal of the transistor M2' is coupled to the I/O power I1 and the core power I2. A second terminal of the transistor M2' is coupled to the signal output terminal DM. In this embodiment, the second terminal of the transistor M1' and the second terminal of the transistor M2' can alternately output the power signal provided by the I/O power I1 or the core power I2 through the signal output terminals DP and DM to form the differential signal. It should be noted that, compared to the power circuits 310 in the embodiment of FIG. 2, the power circuit 510 of the present embodiment includes two power sources, and a voltage of the I/O power I1 is greater than a voltage of the core power I2. The I/O power I1 and the core power I2 may be controlled by a controller (not shown) to selectively output the power signal.

The first load circuit 521 includes resistors R1 and R2 and transistors M3 and M4. A first terminal of the resistor R1 is coupled to the signal output terminal DP. In this embodiment, a first terminal of the transistor M3 is coupled to a second terminal of the resistor R1, and a second terminal of the transistor M3 is coupled to the ground terminal. A first terminal of the resistor R2 is coupled to the signal output terminal DM. A first terminal of the transistor M4 is coupled to a second terminal of the resistor R2, and a second terminal of the transistor M4 is coupled to the ground terminal.

The second load circuit 522 includes resistors R3 and R4, diode units 523 and 524 and transistors M5 and M6. In this embodiment, a first terminal of the resistor R3 is coupled to the signal output terminal DP. The diode unit 523 is coupled to a second terminal of the resistor R3. A first terminal of the transistor M5 is coupled to the diode unit 523, and a second terminal of the transistor M5 is coupled to the ground terminal. A first terminal of the resistor R4 is coupled to the signal output terminal DM. The diode unit 524 is coupled to a second terminal of the resistor R4. A first terminal of the transistor M6 is coupled to the diode unit 524, and a second terminal of the transistor M6 is coupled to the ground terminal. In this embodiment, the diode unit 523 may include a transistor M7, and the diode unit 524 may include a transistor M8. A first terminal of the transistor M7 is coupled to the resistor R3. A control terminal of the transistor M7 is coupled to the first terminal of the transistor M7. A second terminal of the transistor M7 is coupled to the first terminal of the transistor M5. A first terminal of the transistor M8 is coupled to the resistor R4. A control terminal of the transistor M8 is coupled to the first terminal of the transistor M8. A second terminal of the transistor M8 is coupled to the first terminal of the transistor M6. Nevertheless, the diode unit 523 and the diode unit 524 may also be diode circuits in other forms, and the diode unit 523 and the diode unit 524 of the invention are not limited by FIG. 5. In addition, the pull-down circuit 530 includes resistors R5 and R6, and the resistors R5 and R6 may be 15 k Ohm.

In this embodiment, when the USB circuit 500 is operated in the handshake mode, the power circuit 510 outputs the power signal to the first terminal of the transistor M1' and the first terminal of the transistor M2' through the I/O power I1. When the USB circuit 500 is operated in the normal mode, the power circuit 510 outputs the power signal to the first terminal of the transistor M1' and the first terminal of the transistor M2' through the core power I2. However, the transistors M1' and M2' are low voltage devices (core devices) disposed in correspondence to the core power I2 of low voltage. In the advanced manufacturing process, the USB circuit 500 of the present embodiment further includes the protection circuit 540 to prevent the transistors M1' and M2' from being damaged by the voltages of the signal output terminals DP and DM in a full speed mode (with the voltage being 0 V to 3.3 V).

The protection circuit 540 is coupled between the power circuit 510 and the terminating circuit 520. The protection circuit 540 includes transistors M9 and M10. A first terminal of the transistor M9 is coupled to the power circuit 510, and a second terminal of the transistor M9 is coupled to the terminating circuit 520. A first terminal of the transistor M10 is coupled to the power circuit 510, and a second terminal of the transistor M10 is coupled to the terminating circuit 520. In this way, the voltages of the signal output terminals DP and DM in the full speed mode would fall between 0 V and 3.3 V. In this case, by turning off the transistors M9 and M10, the transistors M1' and M2' may be protected from being damaged.

In this embodiment, when the USB circuit 500 is coupled to the device side circuit 400 through the signal output terminals DP and DM, the USB circuit 500 serves as a host, and outputs a USB reset signal to the device side circuit 400. Because the device side circuit 400 supports the USB 2.0 high speed transmission, the device side circuit 400 then outputs the negative pulse signals (the Chirp K signals) to the USB circuit 500 so the USB circuit 500 can confirm that the device side circuit 400 supports the USB 2.0 high speed transmission. Next, the USB circuit 500 alternately returns the negative pulse signals (the Chirp K signals) and the positive pulse signals (the Chirp J signals) to the device side circuit 400 according to the power signal provided by the I/O power I1 so the device side circuit 400 can effectively confirm that the USB circuit 500 supports the USB 2.0 high speed transmission. Lastly, the USB circuit 500 may enter the normal mode, and output the data signal to the device side circuit 400 according to the power signal provided by the core power I2.

Specifically, when the USB circuit 500 is operated in the handshake mode, because the switches S2 and S3 of the device side circuit 400 are not turned on, the terminating circuit 520 would bear a greater current. The USB circuit 500 outputs the positive pulse signals (the Chirp J signals) and the negative pulse signals (the Chirp K signals) to the device side circuit 400 through the signal output terminals DP and DM. That is to say, the transistors M3 and M4 are turned on so the first load circuit 521 can receive a current provided by the I/O power I1. At the time, because voltages of the signal output terminals DP and DM are greater, the transistors M7 and M8 may also be turned on so the first load circuit 521 and the second load circuit 522 can share the current provided by the I/O power I1 at the same time. In other words, when the USB circuit 500 is operated in the handshake mode, the terminating circuit 520 of the present embodiment can effectively prevent the transistors M3 and M4 of the first load circuit 521 from bearing the overly large current, which may make the transistors M3 and M4 entering the saturation region from the linear region thereby causing voltage drift on the pulse signal (the Chirp K signal and the Chirp J signal) output by the signal output terminals DP and DM.

When the USB circuit 500 is operated in the normal mode, the switches S2 and S3 of the device side circuit 400 are turned on so the reference resistors Ra and Rb of the device side circuit 400 and the terminating circuit 520 can share the current at the same time. The USB circuit 500 would alternately output data signals to the device side circuit 400 through the signal output terminals DP and DM. That is to say, the transistors M3 and M4 and the switches S3 and S4 are turned on, and the first load circuit 521 can receive a current provided by the core power I2. At the time, because the voltages of the signal output terminals DP and DM are smaller, the transistors M7 and M8 would not be turned on. Therefore, when the USB circuit 500 is operated in the normal mode, the current provided by the core power I2 would not flow through the second load circuit 522.

Accordingly, when the USB circuit 500 of the present embodiment is operated in the handshake mode, the USB circuit 500 can generate the pulse signal (the Chirp K signal and the Chirp J signal) for the device side circuit 400 through the power signal provided by the I/O power I1 with higher voltage. Further, when the USB circuit 500 of the present embodiment is operated in the normal mode, the USB circuit 500 can generate the data signal for the device side circuit 400 through the power signal provided by the core power I2 with lower voltage. Therefore, other than effectively preventing voltage drift on the voltage of the pulse signal output by the signal output terminals DP and DM, the USB circuit 500 may also effectively reduce power consumption.

Figure 6:
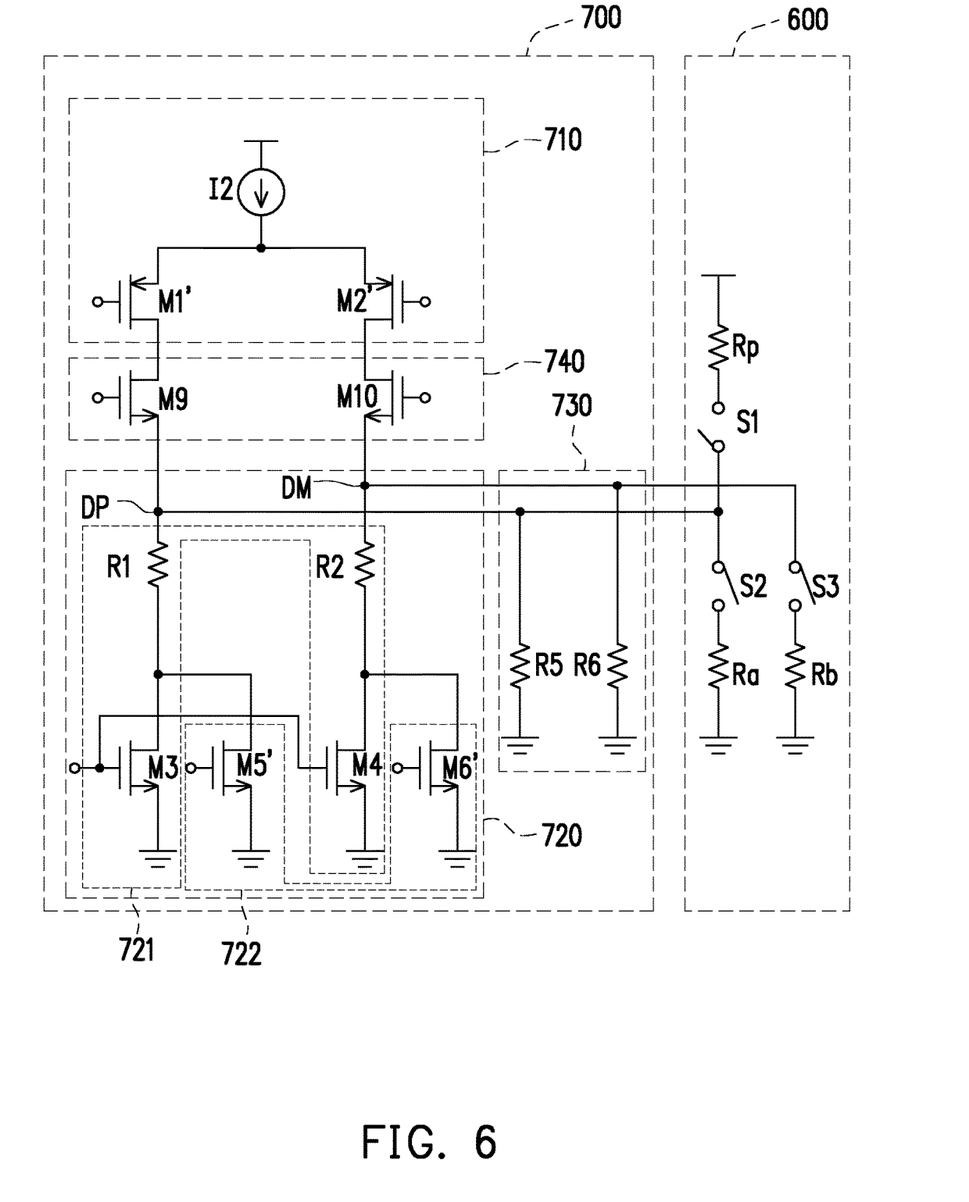
FIG. 6 is a circuit diagram of a USB circuit according to yet another embodiment of the invention.

FIG. 6 is a circuit diagram of a USB circuit according to yet another embodiment of the invention. With reference to FIG. 6, a USB circuit 700 includes a power circuit 710, a terminating circuit 720, a pull-down circuit 730 and a protection circuit 740. The terminating circuit 720 includes a first load circuit 721 and a second load circuit 722. The USB circuit 700 is coupled to a device side circuit 600 through signal output terminals DP and DM. In this embodiment, the device side circuit 600 refers to, for example, an equivalent circuit of a USB port of computer equipment, but the invention is not limited thereto. In this embodiment, the device side circuit 600 may include, for example, a pull-up resistor Rp and reference resistors Ra and Rb. The pull-up resistor Rp is coupled to a switch S1. One terminal of the reference resistor Ra is coupled to a switch S2, and another terminal of the reference resistor Ra is coupled to a ground terminal. One terminal of the reference resistor Rb is coupled to a switch S3, and another terminal of the reference resistor Rb is coupled to the ground terminal.

The power circuit 710 includes a current source circuit and transistors M1' and M2'. The current source circuit includes a core power I2, and the core power I2 may provide, for example, a power signal of 1.05 V. A first terminal of the transistor M1' is coupled to the core power I2. A second terminal of the transistor M1' is coupled to the signal output terminal DP. A first terminal of the transistor M2' is coupled to the core power I2. A second terminal of the transistor M2' is coupled to the signal output terminal DM.

In this embodiment, the second terminal of the transistor M1' and the second terminal of the transistor M2' can alternately output the power signal provided by the core power I2 through the signal output terminals DP and DM to form the differential signal. It should be noted that, compared to the power circuits 510 in the embodiment of FIG. 5, the power circuit 710 of the present embodiment only includes one power source.

The first load circuit 721 includes resistors R1 and R2 and transistors M3 and M4. A first terminal of the resistor R1 is coupled to the signal output terminal DP. In this embodiment, a first terminal of the transistor M3 is coupled to a second terminal of the resistor R1, and a second terminal of the transistor M3 is coupled to the ground terminal. A first terminal of the resistor R2 is coupled to the signal output terminal DM. A first terminal of the transistor M4 is coupled to a second terminal of the resistor R2, and a second terminal of the transistor M4 is coupled to the ground terminal. Control terminals of the transistors M3 and M4 are controlled by a control signal (not shown). Both the transistors M3 and M4 are turned on in either the handshake mode or the normal mode.

The second load circuit 722 includes transistor M5' and M6'. In this embodiment, a first terminal of the transistor M5' is coupled to the first terminal of the transistor M3, and a second terminal of the transistor M5' is coupled to the ground terminal. A first terminal of the transistor M6' is coupled to the transistor M4, and a second terminal of the transistor M6' is coupled to the ground terminal. In addition, the pull-down circuit 730 includes resistors R5 and R6, and the resistors R5 and R6 may be 15 k Ohm. Control terminals of the transistors M5' and M6' are controlled by another control signal (not shown). The transistors M5' and M6' are turned on in the handshake mode. The transistors M5' and M6' are turned off in the normal mode.

In this embodiment, when the USB circuit 700 is operated in the handshake mode, the power circuit 710 outputs the power signal to the first terminal of the transistor M1' and the first terminal of the transistor M2' through the core power I2. When the USB circuit 700 is operated in the normal mode, the power circuit 710 also outputs the power signal to the first terminal of the transistor M1' and the first terminal of the transistor M2' through the core power I2. However, the transistors M1' and M2' are low voltage devices (core devices) disposed in correspondence to the core power I2 of low voltage. In the advanced manufacturing process, the USB circuit 700 of the present embodiment further includes the protection circuit 740 to prevent the transistors M1' and M2' from being damaged by the voltages of the signal output terminals DP and DM in a full speed mode (with the voltage being 0 V to 3.3 V).

The protection circuit 740 is coupled between the power circuit 710 and the terminating circuit 720. The protection circuit 740 includes transistors M9 and M10. A first terminal of the transistor M9 is coupled to the power circuit 710, and a second terminal of the transistor M9 is coupled to the terminating circuit 720. A first terminal of the transistor M10 is coupled to the power circuit 710, and a second terminal of the transistor M10 is coupled to the terminating circuit 720. In this way, the voltages of the signal output terminals DP and DM in the full speed mode would fall between 0 V and 3.3 V. In this case, by turning off the transistors M9 and M10, the transistors M1' and M2' may be protected from being damaged.

In this embodiment, when the USB circuit 700 is coupled to the device side circuit 600 through the signal output terminals DP and DM, the USB circuit 700 serves as a host, and outputs a USB reset signal to the device side circuit 600. Because the device side circuit 600 supports the USB 2.0 high speed transmission, the device side circuit 600 then outputs the negative pulse signals (the Chirp K signals) to the USB circuit 700 so the USB circuit 700 can confirm that the device side circuit 600 supports the USB 2.0 high speed transmission. Next, the USB circuit 700 alternately returns the negative pulse signals (the Chirp K signals) and the positive pulse signals (the Chirp J signals) to the device side circuit 600 according to the power signal provided by the core power I2 so the device side circuit 600 can effectively confirm that the USB circuit 700 supports the USB 2.0 high speed transmission. Lastly, the USB circuit 700 may enter the normal mode, and output the data signal to the device side circuit 600 according to the power signal provided by the core power I2.

Figure 7:
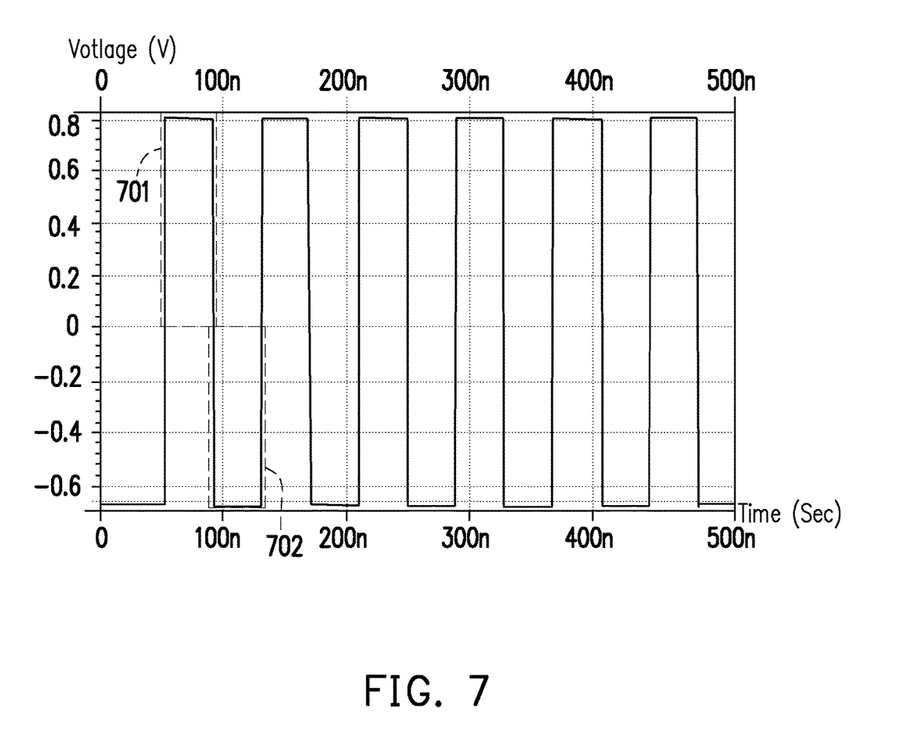
FIG. 7 is a signal waveform diagram of the pulse signal according to the embodiment of FIG. 6.

FIG. 7 is a signal waveform diagram of the pulse signal according to the embodiment of FIG. 6. With reference to FIG. 6 and FIG. 7, when the USB circuit 700 is operated in the handshake mode, the USB circuit 700 can output positive pulse signals 701 and negative pulse signals 702 alternately arranged as shown in FIG. 7 to the device side circuit 600 through the signal output terminals DP and DM. Specifically, when the USB circuit 700 is operated in the handshake mode, because the switches S2 and S3 of the device side circuit 600 are not turned on, the terminating circuit 720 would bear a greater current. Thus, the USB circuit 700 would output the positive pulse signals 701 and the negative pulse signals 702 to the device side circuit 600 through the signal output terminals DP and DM. In this embodiment, a peak voltage of the positive pulse signal 701 may be 800 mV, and a peak voltage of the negative pulse signal 702 may be −700 mV.

That is to say, transistors M3, M4, M5' and M6' are turned on. Therefore, the first load circuit 721 and the second load circuit 722 can receive the current provided by the core power I2 so the first load circuit 721 and the second load circuit 722 can share the current provided by the core power I2 at the same time. In other words, when the USB circuit 700 is operated in the handshake mode, the terminating circuit 720 of the present embodiment can effectively prevent the transistors M3 and M4 of the first load circuit 721 from bearing the overly large current, which may make the transistors M3 and M4 entering the saturation region from the linear region thereby causing voltage drift on the pulse signal (the Chirp K signal and the Chirp J signal) output by the signal output terminals DP and DM.

Referring back to FIG. 6, when the USB circuit 700 is operated in the normal mode, the switches S2 and S3 of the device side circuit 600 are turned on so the reference resistors Ra and Rb of the device side circuit 600 and the terminating circuit 720 can share the current at the same time. The USB circuit 700 would alternately output data signals to the device side circuit 600 through the signal output terminals DP and DM. That is to say, the transistors M3 and M4 and the switches S3 and S4 are turned on, and the first load circuit 721 can receive a current provided by the core power I2. At the time, control terminals of the transistors M5' and M6' are controlled by another control signal (not shown). The transistors M5' and M6' are turned on in the handshake mode. The transistors M5' and M6' are turned off in the normal mode. Therefore, when the USB circuit 700 is operated in the normal mode, the current provided by the core power I2 would not flow through the second load circuit 722.

Accordingly, regardless of whether the USB circuit 700 is operated in the normal mode or the handshake mode, the USB circuit 700 can generate the pulse signal (the Chirp J signal and the Chirp K signal) and the data signal for the device side circuit 600 through the power signal provided by the core power I2 with lower voltage. Therefore, other than effectively preventing voltage drift on the voltage of the pulse signal output by the signal output terminals DP and DM, the USB circuit 700 may also effectively reduce power consumption. More importantly, compared to the USB circuit 500 in the embodiment of FIG. 5, the terminating circuit 720 of the USB circuit 700 of the present embodiment can effectively generate the pulse signal (the Chirp J signal and the Chirp K signal) and the data signal simply through less transistors. Therefore, the USB circuit 700 can further provide features of lower cost and smaller area for manufacturing the transistors.

In addition, each transistor described in each of the foregoing embodiments may be transistor elements like a MOS (Metal Oxide Semiconductor) transistor or a BJT (Bipolar Junction Transistor) or the like. The invention is not limited in this regard. Also, the type of each transistor described in each of the foregoing embodiments may be an N-type transistor or a P-type transistor. The invention is not limited in this regard either.

In summary, during the handshake mode, the USB circuit of the invention can stably output the pulse signal (the Chirp K signal and the Chirp J signal) to the device side circuit so the device side circuit can effectively confirm the data transmission capability of the USB circuit. Also, with the specific design of the power circuit and the load circuits, the USB circuit of the invention can further reduce power consumption of the USB circuit and reduce the area for manufacturing the transistors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A universal serial bus circuit, comprising:
    a power circuit, configured to provide a differential signal pair; and
    a terminating circuit, coupled to the power circuit, and configured to receive the differential signal pair through a first signal output terminal and a second signal output terminal, wherein the terminating circuit comprises a first load circuit and a second load circuit,
    wherein when the universal serial bus circuit is operated in a handshake mode, the terminating circuit receives the differential signal pair through the first load circuit and the second load circuit, and outputs a pulse signal pair through the first signal output terminal and the second signal output terminal,
    wherein when the universal serial bus circuit is operated in a normal mode, the terminating circuit receives the differential signal pair through the first load circuit, and outputs a data signal through the first signal output terminal and the second signal output terminal.

2. The universal serial bus circuit according to claim 1, wherein the power circuit comprises:
    a current source circuit, configured to output a power signal;
    a first transistor, wherein a first terminal of the first transistor is coupled to the current source circuit, and a second terminal of the first transistor is coupled to the first signal output terminal; and
    a second transistor, wherein a first terminal of the second transistor is coupled to the current source circuit, and a second terminal of the second transistor is coupled to the second signal output terminal,
    wherein the second terminal of the first transistor and the second terminal of the second transistor alternately output the power signal through the first signal output terminal and the second signal output terminal to form the differential signal pair.

3. The universal serial bus circuit according to claim 2, wherein the current source circuit comprises an input/output power, and the input/output power is coupled to the first terminal of the first transistor and the first terminal of the second transistor.

4. The universal serial bus circuit according to claim 2, wherein the current source circuit comprises a core power and an input/output power, and the core power and the input/output power are coupled to the first terminal of the first transistor and the first terminal of the second transistor,
    wherein when the universal serial bus circuit is operated in the handshake mode, the input/output power outputs a first power signal to the first terminal of the first transistor and the first terminal of the second transistor,
    wherein when the universal serial bus circuit is operated in the normal mode, the core power outputs a second power signal to the first terminal of the first transistor and the first terminal of the second transistor.

5. The universal serial bus circuit according to claim 4, wherein a voltage of the first power signal is greater than a voltage of the second power signal.

6. The universal serial bus circuit according to claim 2, wherein the current source circuit comprises a core power, and the core power is coupled to the first terminal of the first transistor and the first terminal of the second transistor.

7. The universal serial bus circuit according to claim 1, wherein the first load circuit comprises:
    a first resistor, wherein a first terminal of the first resistor is coupled to the first signal output terminal;
    a third transistor, wherein a first terminal of the third transistor is coupled to a second terminal of the first resistor, and a second terminal of the third transistor is coupled to a ground terminal;
    a second resistor, wherein a first terminal of the second resistor is coupled to the second signal output terminal; and
    a fourth transistor, wherein a first terminal of the fourth transistor is coupled to a second terminal of the second resistor, and a second terminal of the fourth transistor is coupled to the ground terminal.

8. The universal serial bus circuit according to claim 7, wherein the second load circuit comprises:
    a third resistor, wherein a first terminal of the third resistor is coupled to the first signal output terminal;
    a first diode unit, coupled to a second terminal of the third resistor;
    a fifth transistor, wherein a first terminal of the fifth transistor is coupled to the first diode unit, and a second terminal of the fifth transistor is coupled to the ground terminal;
    a fourth resistor, wherein a first terminal of fourth resistor is coupled to the second signal output terminal;
    a second diode unit, coupled to a second terminal of the fourth resistor; and
    a sixth transistor, wherein a first terminal of the sixth transistor is coupled to the second diode unit, and a second terminal of the sixth transistor is coupled to the ground terminal.

9. The universal serial bus circuit according to claim 8, wherein when the universal serial bus circuit is operated in the normal mode, the first diode unit and the second diode unit are not turned on, wherein when the universal serial bus circuit is operated in the handshake mode, the first diode unit and the second diode unit are turned on according to the differential signal pair provided by the power circuit.

10. The universal serial bus circuit according to claim 8, wherein the first diode unit comprises a seventh transistor, wherein a first terminal of the seventh transistor is coupled to the third resistor, a control terminal of the seventh transistor is coupled to the first terminal of the seventh transistor, and a second terminal of the seventh transistor is coupled to the first terminal of the fifth transistor.

11. The universal serial bus circuit according to claim 8, wherein the second diode unit comprises an eighth transistor, wherein a first terminal of the eighth transistor is coupled to the fourth resistor, a control terminal of the eighth transistor is coupled to the first terminal of the eighth transistor, and a second terminal of the eighth transistor is coupled to the first terminal of the sixth transistor.

12. The universal serial bus circuit according to claim 7, wherein the second load circuit comprises:
a ninth transistor, wherein a first terminal of the ninth transistor is coupled to the first terminal of the third transistor, and a second terminal of the ninth transistor is coupled to the ground terminal; and
a tenth transistor, wherein a first terminal of the tenth transistor is coupled to the first terminal of the fourth transistor, and a second terminal of the tenth transistor is coupled to the ground terminal.

13. The universal serial bus circuit according to claim 12, wherein when the universal serial bus circuit is operated in the normal mode, the ninth transistor and the tenth transistor are not turned on, wherein when the universal serial bus circuit is operated in the handshake mode, the ninth transistor and the tenth transistor are turned on to receive the differential signal pair provided by the power circuit.

14. The universal serial bus circuit according to claim 1, further comprising:
a protection circuit, coupled between the power circuit and the terminating circuit, wherein the protection circuit comprises:
an eleventh transistor, wherein a first terminal of the eleventh transistor is coupled to the power circuit, and a second terminal of the eleventh transistor is coupled to the terminating circuit; and
a twelfth transistor, wherein a first terminal of the twelfth transistor is coupled to the power circuit, and a second terminal of the twelfth transistor is coupled to the terminating circuit.

15. The universal serial bus circuit according to claim 1, further comprising:
a pull-down circuit, coupled to the first signal output terminal and the second signal output terminal, wherein the pull-down circuit comprises:
a fifth resistor, wherein a first terminal of the fifth resistor is coupled to the first signal output terminal, and a second terminal of the fifth resistor is coupled to a ground terminal; and
a sixth resistor, wherein a first terminal of the sixth resistor is coupled to the second signal output terminal, and a second terminal of the sixth resistor is coupled to the ground terminal.

16. The universal serial bus circuit according to claim 1, wherein the pulse signal pair respectively comprises a plurality of negative pulse signals and a plurality of positive pulse signals, and the negative pulse signals and the positive pulse signals are alternately arranged.

* * * * *